(12) United States Patent
Lin et al.

(10) Patent No.: US 7,790,505 B2
(45) Date of Patent: Sep. 7, 2010

(54) SEMICONDUCTOR CHIP PACKAGE MANUFACTURING METHOD AND STRUCTURE THEREOF

(75) Inventors: Chian-Chi Lin, Kaohsiung (TW);
Chih-Huang Chang, Kaohsiung (TW);
Yueh-Lung Lin, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 508 days.

(21) Appl. No.: 11/871,319

(22) Filed: Oct. 12, 2007

(65) Prior Publication Data
US 2008/0096321 A1 Apr. 24, 2008

(30) Foreign Application Priority Data
Oct. 18, 2006 (TW) .............................. 95138478 A

(51) Int. Cl.
*H01L 21/00* (2006.01)
(52) U.S. Cl. ................. 438/113; 257/E21.599
(58) Field of Classification Search ......... 438/106–114, 438/126, 127, 459–465
See application file for complete search history.

(56) References Cited
U.S. PATENT DOCUMENTS

| | | | |
|---|---|---|---|
| 6,040,235 A | 3/2000 | Badehi | |
| 6,271,469 B1 | 8/2001 | Ma et al. | |
| 6,689,638 B2 * | 2/2004 | Lin et al. | 438/118 |
| 7,229,846 B2 * | 6/2007 | Feng | 438/26 |
| 7,285,434 B2 * | 10/2007 | Yee et al. | 438/26 |
| 7,371,602 B2 * | 5/2008 | Yee | 438/64 |
| 7,408,244 B2 * | 8/2008 | Lee et al. | 257/666 |
| 2002/0019069 A1 * | 2/2002 | Wada | 438/69 |
| 2008/0009102 A1 * | 1/2008 | Yang et al. | 438/126 |

* cited by examiner

*Primary Examiner*—Savitri Mulpuri
(74) *Attorney, Agent, or Firm*—Volentine & Whitt, P.L.L.C.

(57) ABSTRACT

A semiconductor chip package manufacturing method and a structure thereof are provided. The manufacturing method includes: providing a base having an image sensor chip and an encapsulant, in which the image sensor chip has pads and an active area; placing a transparent insulator on the active area; forming an insulation layer on an upper surface of the base; opening a plurality of openings to expose the pads; forming a plurality of through holes penetrating the insulation layer and the encapsulant outside of the image sensor chips; forming a metal layer on surfaces of the insulation layer, the openings, the pads and the through holes, and on a lower surface of the base, so as to extend the pads to the lower surface of the base; patterning the metal layer to expose a top area of the transparent insulator and remove a partial area of the metal layer on the lower surface of the base to form contacts; and sawing the base to form a package structure containing a single image sensor chip.

7 Claims, 8 Drawing Sheets

SEMICONDUCTOR CHIP PACKAGE MANUFACTURING METHOD AND STRUCTURE THEREOF

BACKGROUND OF THE INVENTION

1. Field of the Invention

The present invention relates to a semiconductor chip package manufacturing method and a structure thereof. More particularly, the present invention relates to a method of manufacturing a package structure without bumps applicable for an image sensor element and a structure thereof.

2. Description of the Related Art

FIG. 1A shows a semiconductor chip packaging method disclosed in U.S. Pat. No. 6,040,235. According to the technology of the patent, an active surface of a wafer 110 is covered by an insulating material 120, such as glass, which extends from contacts of the active surface of the wafer to a back surface of the wafer. The wafer is sawn into a plurality of chips, and the contact of each chip is extended to the surface of the package through a metal wire 130. However, if there is an excessive amount of defective chips in each wafer, for example, half of the chips are defective in a wafer, this type of packaging method cannot achieve an excellent effect.

Additionally, FIG. 1B shows a semiconductor chip packaging method disclosed in U.S. Pat. No. 6,271,469. In the patent, a colloid 140 serves as a base for supporting a chip 150, then an insulation layer 160 is formed, and a metal wire 170 is formed on the insulation layer. A package structure without bumps can be formed by this process. However, since hollowed-out openings cannot be formed on the surface of the semiconductor chip, this manufacturing method and structure are not applicable for packing the semiconductor chips that must have air contact an active surface in order to function, such as an image sensor element or a temperature- and humidity-sensing element, and thereby, the application field is limited.

Therefore, it is necessary to provide a semiconductor chip package manufacturing method and a structure thereof to solve the above problems.

SUMMARY OF THE INVENTION

The object of the present invention is to provide a semiconductor chip package manufacturing method and a structure thereof. The package structure has contacts extending from an active surface of the chip to a back surface of the chip, and has opening structures required by an image sensor chip on the active area of the active surface of the chip.

In order to solve the above problem, the technical means of the present invention includes a semiconductor chip package manufacturing method and a structure thereof. The manufacturing method includes: providing a base having an upper surface and a lower surface, a plurality of image sensor chips and an encapsulant surrounding the image sensor chips, each image sensor chip having an active surface even with the upper surface of the base and a back surface even with the lower surface of the base, the active surface having a plurality of pads thereon, and an active area; placing a transparent insulator on the active area of each image sensor chip; forming an insulation layer on the upper surface of the base; forming a plurality of openings on the insulation layer, in which the openings are located at the image sensor chip pads, so as to expose the pads; forming a plurality of through holes penetrating the insulation layer and the encapsulant of the base on the outer side of the image sensor chips; forming a metal layer on surfaces of the insulation layer, the openings, the pads, the through holes, and on the lower surface of the base, so as to extend the pads to the lower surface of the base; patterning the metal layer to expose a top area of the transparent insulator and remove a partial area of the metal layer on the lower surface of the base, so as to form a plurality of contacts; and performing a sawing process to form a plurality of package structures, each containing a single image sensor chip.

In the semiconductor chip package manufacturing method and the structure thereof according to the present invention, contacts of the active surface of the chip can be extended to the back surface of the chip by utilizing the manufacturing method thereof, so as to form packages without bumps. Moreover, openings can be formed above the active area of the active surface of the chip packaged according to this manufacturing method, so that the chip elements are under the light source, and thus the manufacturing method is applicable to the packaging of optical elements such as an image sensor element.

DETAILED DESCRIPTION OF THE INVENTION

Figure 1A:
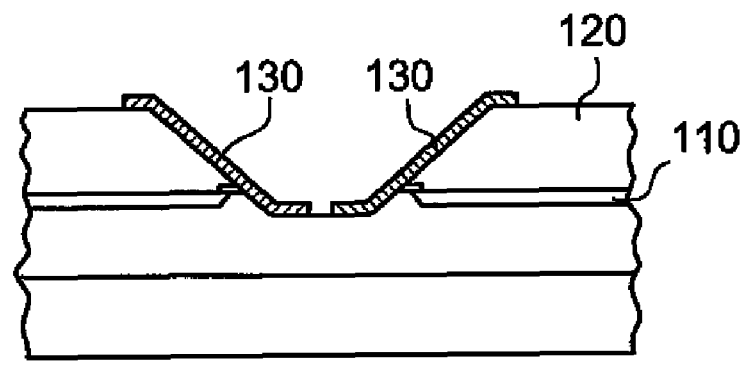
FIG. 1A is a semiconductor chip package structure according to a prior art.
Figure 1B:
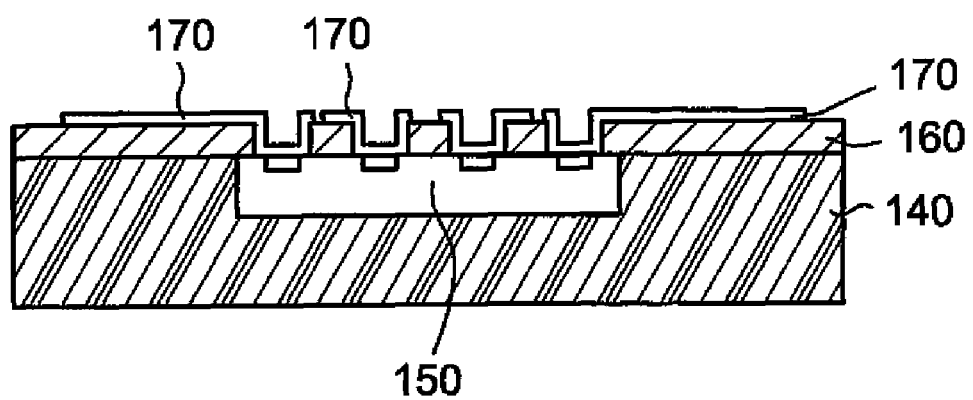
FIG. 1B is a semiconductor chip package structure according to another prior art.

FIGS. 2A, 2B, 2C, 2D, 2E, 2F, 2G, and 2H show schematic sectional views of a manufacturing process according to a first embodiment of the present invention. The manufacturing method includes the following steps. Firstly, referring to FIG. 2A, providing a base 21 having an upper surface 211 and a lower surface 212, a plurality of image sensor chips 213 and an encapsulant 214 surrounding the image sensor chips 213. Each image sensor chip 213 has an active surface 2131 even with the upper surface 211 of the base 21 and a back surface 2132 even with the lower surface 212 of the base 21. The active surface 2131 has a plurality of pads 21311 thereon and an active area 21312.

Figure 2A:
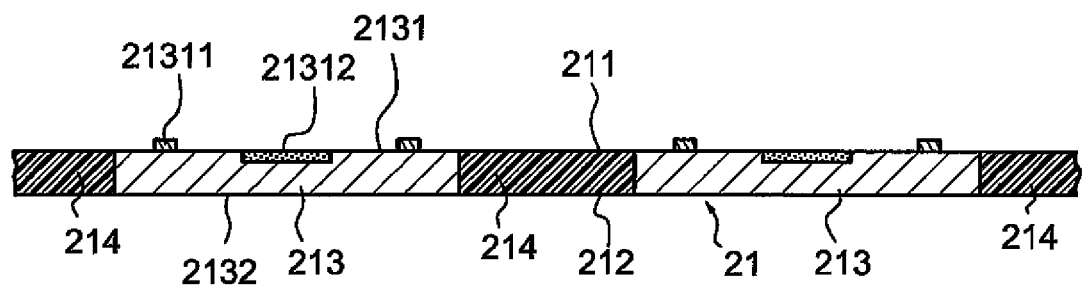
FIGS. 2A, 2B, 2C, 2D, 2E, 2F, 2G, and 2H are schematic sectional views of a manufacturing process according to a first embodiment of the present invention.
Figure 2B:
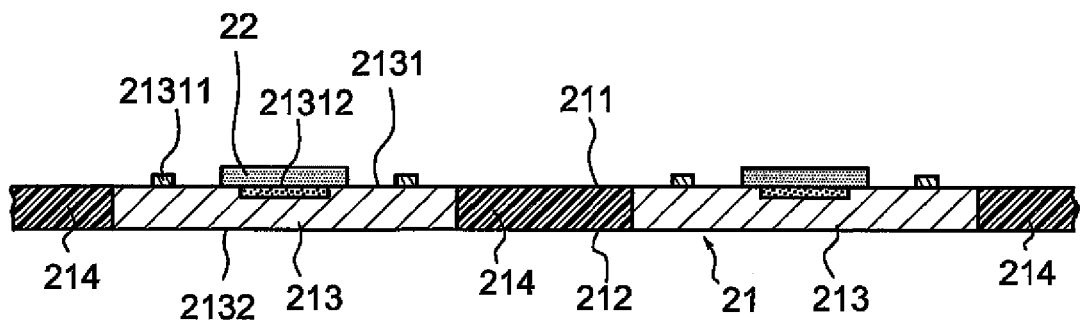

Then, referring to FIG. 2B, covering a transparent insulator 22, for example, by means of directly covering a transparent colloid, or by means of placing glass on the active area 21312 of each image sensor chip 213, in which the transparent insulator 22 can also be supported by a spacer 31 (FIG. 5B) to keep a gap between the image sensor chip 213 and the transparent insulator 22.

Figure 2C:
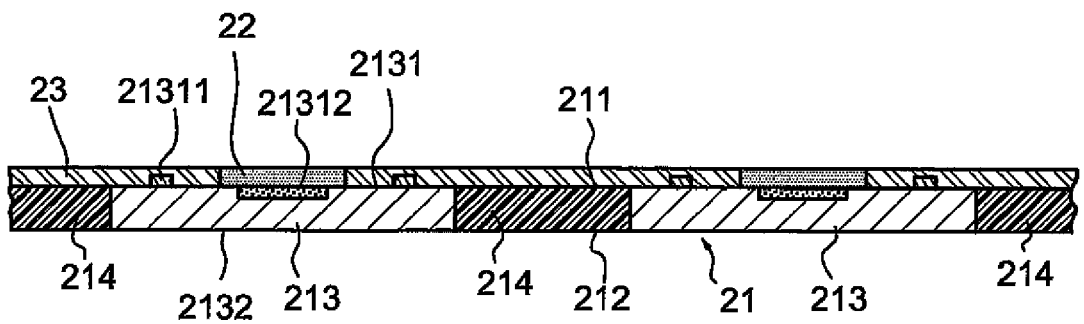
Figure 2D:
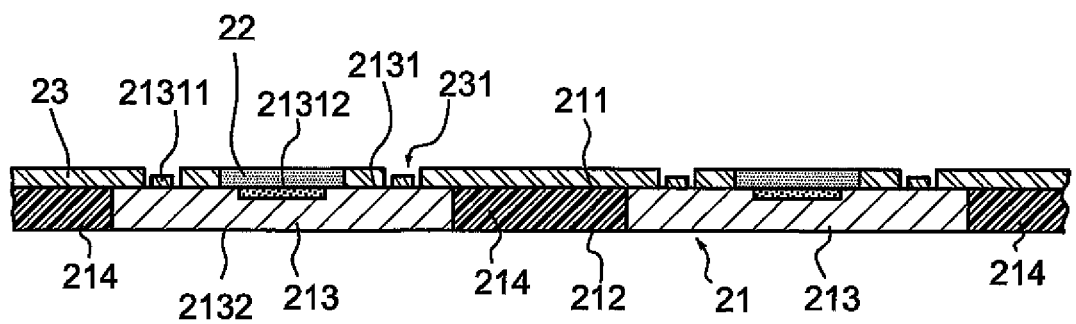

Then, referring to FIG. 2C, forming an insulation layer 23 on the upper surface 211 of the base 21, which preferably has a thickness that is substantially the same as the transparent insulator 22. Then, referring to FIG. 2D, forming a plurality of openings 231 by, for example, photolithography, on the insulation layer 23 which is located at the positions corresponding to the pads 21311 of the image sensor chip 213 to expose the pads 21311.

Figure 2E:
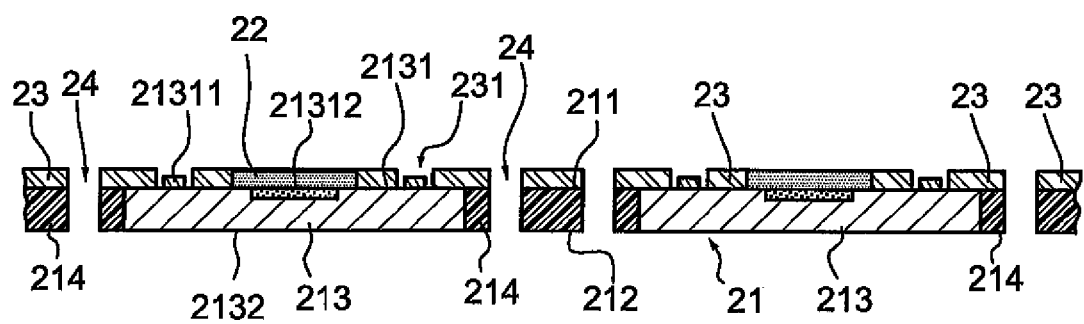
Figure 2F:
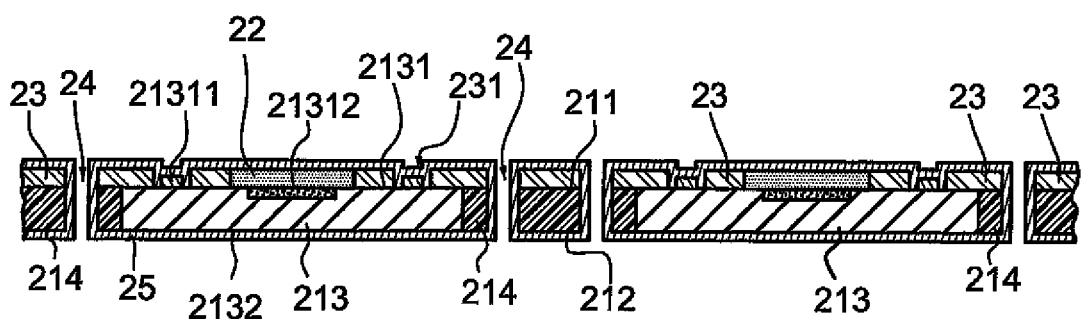

Then, referring to FIG. 2E, forming a plurality of through holes 24 outside of the image sensor chips 213. The through holes 24 penetrate the insulation layer 23 and the encapsulant 214 of the base 21. Then, referring to FIG. 2F, forming a metal layer 25 on surfaces of the insulation layer 23, the openings 231, the pads 21311, and the through holes 24, and on the lower surface of the base 21, so as to extend the pads 21311 to the lower surface of the base 21. The metal layer 25 is formed by firstly plating a metal seed layer on the surface (not shown) by sputtering, and then forming the metal layer 25 on the metal seed layer by electroplating, so that the metal layer 25 has sufficient thickness.

Figure 2G:
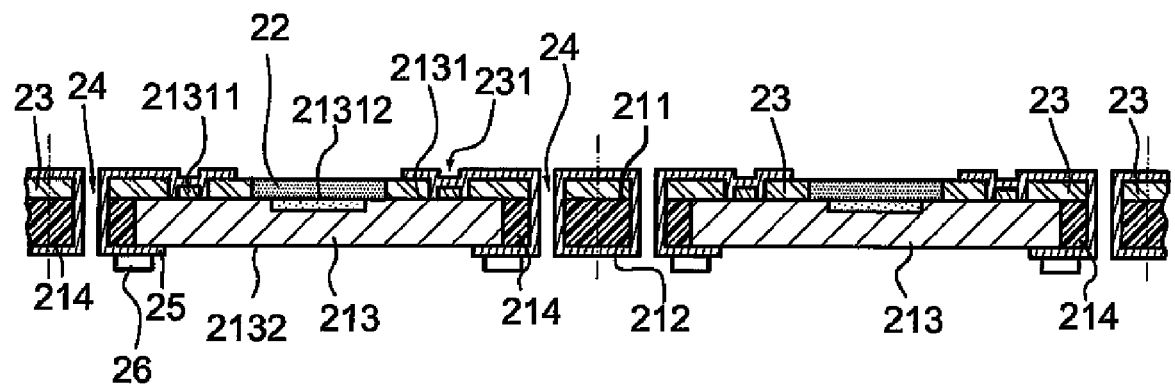
Figure 2H:
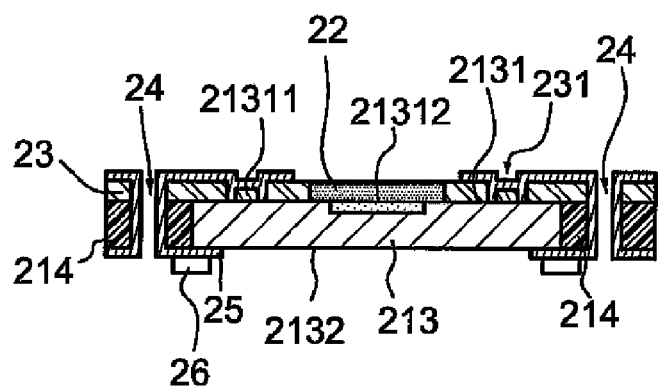

Then, referring to FIG. 2G, patterning the metal layer 25 to expose a top area of the transparent insulator 22 and remove a partial area of the metal layer 25 on the lower surface of the base 21, so as to form a plurality of contacts 26. Finally, referring to FIG. 2H, performing a sawing process to form a plurality of semiconductor chip package structures, each containing a single image sensor chip 213.

Figure 3A:
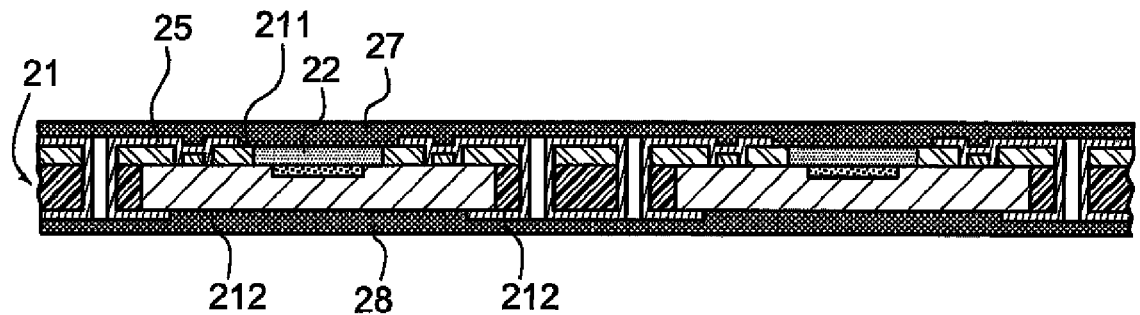
FIGS. 3A, 3B, 3C, 3D, and 3E are schematic sectional views of a manufacturing process according to a second embodiment of the present invention.
Figure 3B:
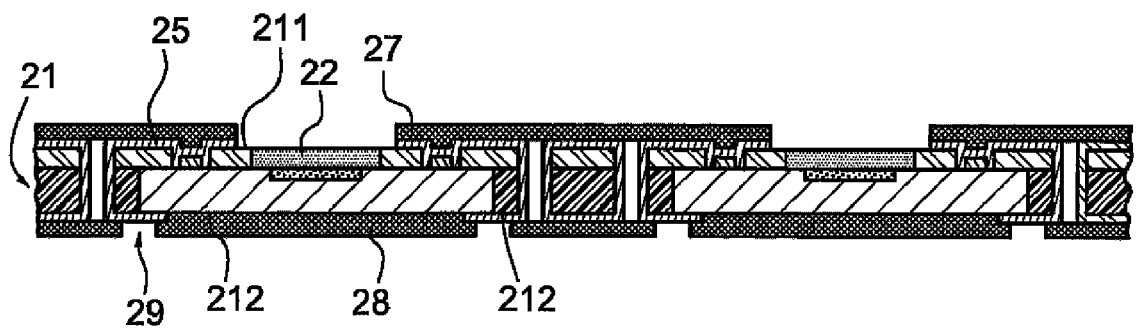
Figure 3C:
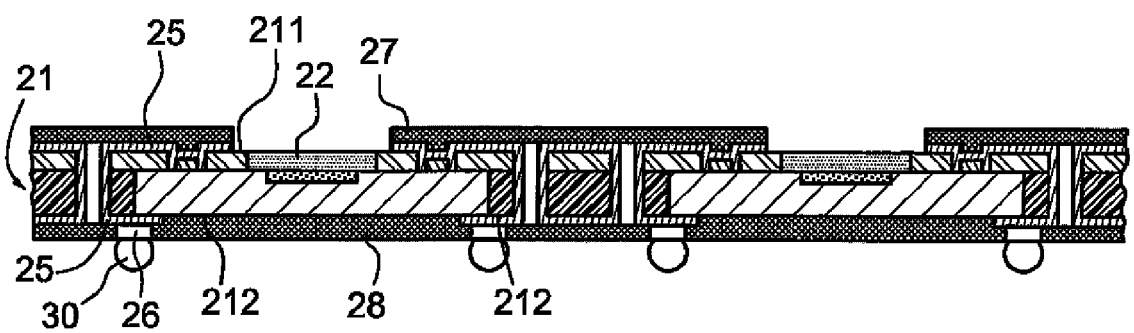
Figure 3D:
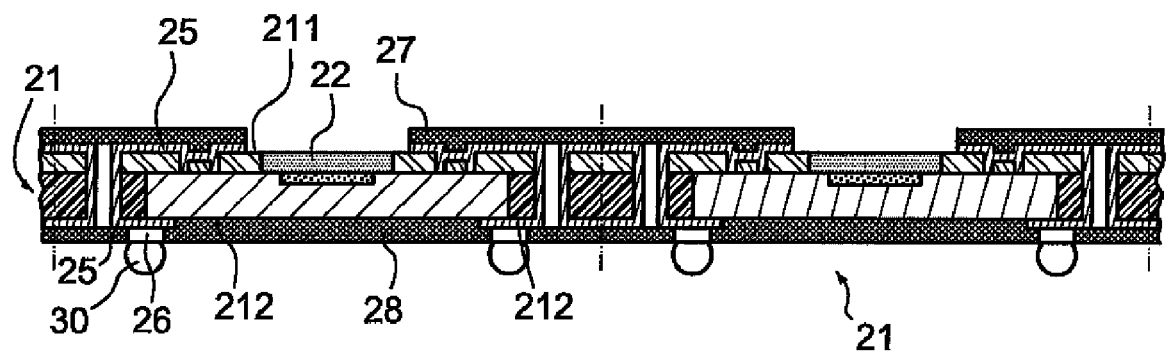
Figure 3E:
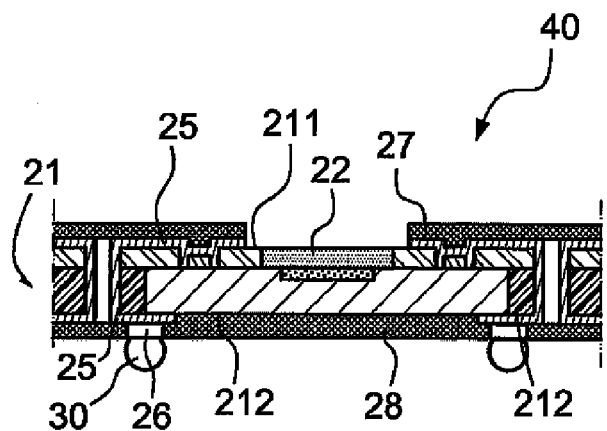

FIGS. 3A, 3B, 3C, 3D, and 3E show schematic sectional views of a manufacturing process according to a second embodiment of the present invention. The first embodiment of the present invention can also be further modified into the second embodiment as follows. After the step of patterning the metal layer 25 to expose the top area of the transparent insulator 22 in the first embodiment and before the step of performing the sawing process, the manufacturing process further includes the following steps. Referring to FIG. 3A, forming an upper passivation layer 27 and a lower passivation layer 28, in which the upper passivation layer 27 is disposed above the upper surface 211 of the base 21, and the lower passivation layer 28 is disposed above the lower surface 212 of the base 21. The lower passivation layer 28 has a plurality of ball mounting positions (not shown). Then, referring to FIG. 3B, forming a plurality of openings 29 at the ball-mounting positions of the lower passivation layer 28 and the corresponding positions at the top of the transparent insulator 22 of the upper passivation layer 27, so as to expose the contact 26 and to expose the top surface of the transparent insulator 22. Finally, referring to FIG. 3C, forming a plurality of solder balls 30 at each contact 26 of the lower passivation layer 28, so that the solder balls 30 and the metal layer 25 are electrically connected. Finally, referring to FIGS. 3D and 3E, performing a sawing process to form a plurality of semiconductor chip package structures 40.

In the first embodiment or the second embodiment, before the step of forming a plurality of through holes 24 on the outer side of the image sensor chips 213, the manufacturing process further includes forming a stress buffer layer 32 (FIG. 5A) on the lower surface of the base. The through holes 24 further penetrate the stress buffer layer 32.

In the first embodiment or the second embodiment, the step of covering a transparent insulator 22 further includes attaching a protective tape (not shown) to the top surface of the transparent insulator 22, and the step of forming a plurality of solder balls 30 further includes removing the protective tape.

Figure 4A:
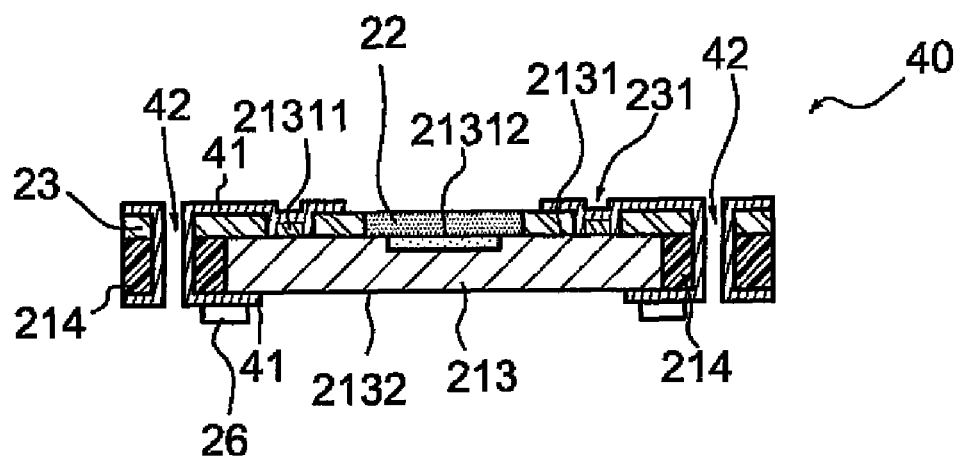
FIG. 4A is a schematic sectional view of a package structure according to the first embodiment of the present invention.

FIG. 4A shows a schematic sectional view of a package structure according to the first embodiment of the present invention. A semiconductor chip package structure 40 includes: an image sensor chip 213, a transparent insulator 22, an insulation layer 23, a patterned metal layer 41 and a plurality of vias 42. The image sensor chip 213 includes an active surface 2131 and an opposite back surface 2132. The active surface 2131 has an active area 21312 and a plurality of pads 21311.

The transparent insulator 22 is disposed on the active area 21312 of the image sensor chip 213. The insulation layer 23 is formed on the active surface 2131 of the image sensor chip 213, and covers the peripheral region of the active surface of the image sensor chip 213, and has a plurality of openings 231 for exposing the pads 21311 of the image sensor chip 213. The insulation layer 23, for example, is made of epoxy resin and an upper surface of the insulation layer 23 at the same height as the top surface of the transparent insulator. The patterned metal layer 41 is formed on the insulation layer 23, the openings 231 and partial area of the back surface of the image sensor chip 213. A plurality of contacts 26 is formed on the back surface of the image sensor chip 213. The patterned metal layer 41 is electrically connected to the pads 21311. The vias 42 penetrate the insulation layer 23 and are electrically connected to the patterned metal layer 41.

Figure 4B:
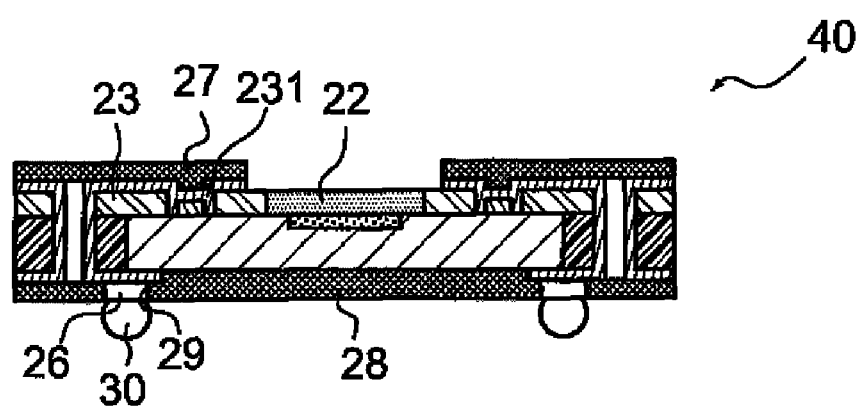
FIG. 4B is a schematic sectional view of a package structure according to the second embodiment of the present invention.

Next, referring to FIG. 4B, a modified structure of the semiconductor chip package structure 40 further includes an upper passivation layer 27 and a lower passivation layer 28. The upper passivation layer 27 and the lower passivation layer, for example, are solder mask layers. The upper passivation layer 27 is formed above the upper surface of the insulation layer 23 and exposes the transparent insulator 22. The lower passivation layer 28 is formed above the back surface of the image sensor chip 213 and has at least one opening 29 to expose the contacts 26. The modified structure further includes a plurality of solder balls 30 formed on the contacts 26.

Figure 5A:
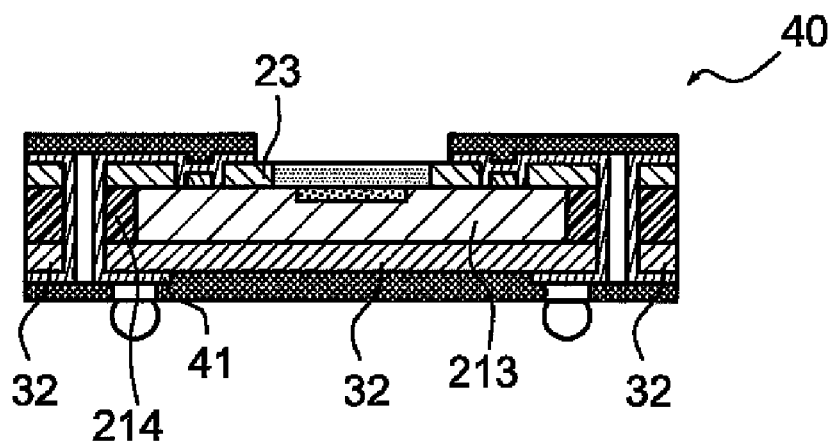
FIG. 5A is a schematic sectional view of a package structure of a stress buffer layer formed on the back surface of an image sensor chip and the lower surface of an insulation layer according to the present invention.

Next, referring to FIG. 5A, a modified structure of the semiconductor chip package structure 40 further includes a stress buffer layer 32 which is disposed between the encapsulant 214 and the patterned metal layer 41, and is formed on the back surface of the image sensor chip 213 and the lower surface of the encapsulant 214. The patterned metal layer 41 covers portion of a bottom surface of the stress buffer layer 32.

Figure 5B:
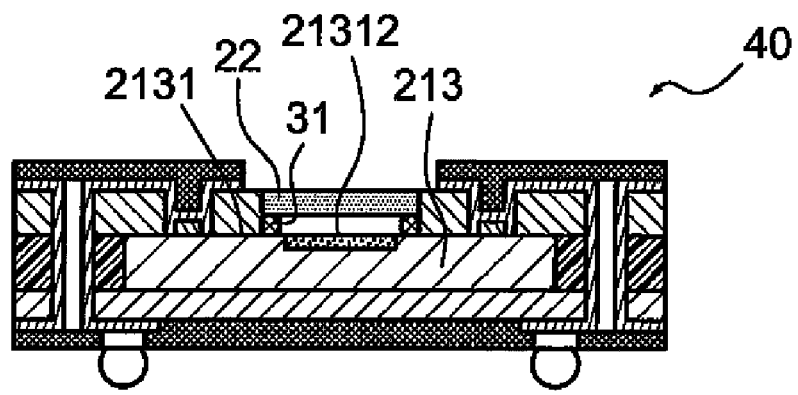
FIG. 5B is a schematic sectional view of a package structure of a transparent insulator supported by a spacer according to the present invention.

Next, referring to FIG. 5B, the semiconductor chip package structure 40 further includes a spacer 31 disposed on the active surface 2131 of the image sensor chip 213. The spacer 31 supports the transparent insulator 22, so that the transparent insulator 22 crosses the active area 21312 of the image sensor chip 213 and a gap is kept between the transparent insulator 22 and the active area 21312 of the image sensor chip 213.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A semiconductor chip package manufacturing method, comprising:

providing a base, having an upper surface, a lower surface, a plurality of image sensor chips and an encapsulant, the encapsulant surrounding the image sensor chips, each of the image sensor chips having an active surface even with the upper surface of the base and a back surface even with the lower surface of the base, the active surface having a plurality of pads thereon, and an active area;

placing a transparent insulator on the active area of each of the image sensor chips;

forming an insulation layer on the upper surface of the base;

forming a plurality of openings on the insulation layer, wherein the openings are located at the positions corresponding to the image sensor chip pads, so as to expose the pads;

forming a plurality of through holes outside of the image sensor chips, wherein the through holes penetrate the insulation layer and the encapsulant of the base;

forming a metal layer on surfaces of the insulation layer, the openings, the pads, the through holes, and on the lower surface of the base, so as to extend the pads to the lower surface of the base;

patterning the metal layer, so as to expose a top area of the transparent insulator and remove a partial area of the metal layer on the lower surface of the base, so as to form a plurality of contacts; and performing a sawing process to form a plurality of package structures, wherein each of the package structures comprises a single image sensor chip, wherein after patterning the metal layer and before the sawing process, the method further comprises: forming an upper passivation layer and a lower passivation layer, wherein the upper passivation layer is located above the upper surface of the base, and the lower passivation layer is located above the lower surface of the base, the lower passivation layer has a plurality of ball-mounting positions; forming a plurality of openings at the ball-mounting positions of the lower passivation layer and the corresponding positions at the top of the transparent insulator of the upper passivation layer, so as to expose the contacts and to expose the top surface of the transparent insulator;

and forming a plurality of solder balls at each contact of the lower passivation layer, so as to form electrical connections between the solder balls and the metal layer.

2. The semiconductor chip package manufacturing method as claimed in claim 1, wherein before forming a plurality of through holes on the outer side of the image sensor chips, the method further comprises forming a stress buffer layer on the lower surface of the base.

3. The semiconductor chip package manufacturing method as claimed in claim 2, wherein the through holes further penetrate the stress buffer layer.

4. The semiconductor chip package manufacturing method as claimed in claim 1, wherein the step of placing a transparent insulator further comprises attaching a protective tape to the top surface of the transparent insulator in advance, and the step of forming a plurality of solder balls further comprises removing the protective tape.

5. The semiconductor chip package manufacturing method as claimed in claim 1, wherein the step of placing a transparent insulator comprises directly disposing a transparent colloid on the active area of each of the image sensor chips.

6. The semiconductor chip package manufacturing method as claimed in claim 1, wherein the step of covering a transparent insulator comprises supporting the transparent insulator with a spacer on the active area of each of the image sensor chips, so as to keep a gap between each of the image sensor chips and the transparent insulator.

7. The semiconductor chip package manufacturing method as claimed in claim 1, wherein the step of forming a metal layer comprises plating a metal seed layer by sputtering, and forming the metal layer on the metal seed layer by electroplating.

* * * * *